United States Patent
Shiobara et al.

(12)

(10) Patent No.: US 6,500,564 B1
(45) Date of Patent: Dec. 31, 2002

(54) SEMICONDUCTOR ENCAPSULATING EPOXY RESIN COMPOSITION AND SEMICONDUCTOR DEVICE

(75) Inventors: Toshio Shiobara, Gunma-ken (JP); Kazuhiro Arai, Gunma-ken (JP); Hidenori Mizushima, Gunma-ken (JP); Shigeki Ino, Gunma-ken (JP); Yasuo Kimura, Gunma-ken (JP); Takayuki Aoki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/641,817

(22) Filed: Aug. 18, 2000

(30) Foreign Application Priority Data

Aug. 19, 1999 (JP) ............................. 11-232198

(51) Int. Cl.$^7$ ............................. H01L 29/12
(52) U.S. Cl. ............ 428/620; 257/787; 257/789; 257/793; 257/795; 428/417; 428/418; 523/211; 523/434; 523/440
(58) Field of Search ............... 257/787, 789, 257/793, 795; 428/417, 418, 620; 523/211, 434, 440

(56) References Cited

U.S. PATENT DOCUMENTS 6,168,872 B1 * 1/2001 Ohashi ..................... 428/620
6,248,454 B1 * 6/2001 Ikemura ................... 428/620

FOREIGN PATENT DOCUMENTS

| JP | 8-259666 | 10/1996 |
| JP | 10182949 | * 7/1998 |

OTHER PUBLICATIONS

Semiconductor International, pp. 214–218 (May 1989).
Nikkei Microdevices, pp. 66–67 (Jul. 1987).

* cited by examiner

Primary Examiner—Robert Dawson
Assistant Examiner—D. Aylward
(74) Attorney, Agent, or Firm—Birch, Stewart, Kolasch & Birch, LLP

(57) ABSTRACT

An epoxy resin composition comprising (A) a polyfunctional epoxy resin, (B) a phenolic resin, (C) an inorganic filler, and (D) curing catalyst-containing microcapsules having a mean particle size of 0.5–50 μm is suited for semiconductor package encapsulation since it minimizes the warpage of packages and has satisfactory catalyst latency, storage stability and cure.

11 Claims, No Drawings

SEMICONDUCTOR ENCAPSULATING EPOXY RESIN COMPOSITION AND SEMICONDUCTOR DEVICE

This invention relates to a semiconductor encapsulating epoxy resin composition having satisfactory cure, catalyst latency, storage stability and adhesion and a semiconductor device encapsulated with the cured product thereof.

BACKGROUND OF THE INVENTION

The semiconductor devices in use today are predominantly resin encapsulated diodes, transistors, integrated circuit (IC) chips, large scale integration (LSI) chips, and very large scale integration (VLSI) chips. Resin encapsulation is usually carried out with epoxy resin compositions because epoxy resins offer superior properties (e.g., moldability, adhesion, electrical characteristics, mechanical characteristics, and moisture resistance), compared with other thermosetting resins.

For cost reduction purposes, attempts to improve the package manufacturing cycle have been made in the semiconductor art. The epoxy resin compositions are required to be fast-curing. However, increasing the amount of catalyst to impart fast-curing tends to cause gold wire flow and short-filling during molding because of thickening and rapid curing. The increased amount of catalyst has another problem that the epoxy resin composition loses storage stability.

On the other hand, a variety of shapes have been developed for the semiconductor package. When packages of advanced design are encapsulated with conventional epoxy resin compositions, the packages warp so that they cannot be mounted on boards. This is a serious problem with thin packages such as thin small outline packages (TSOP) and single-side molded packages such as ball grid arrays (BGA).

For reducing the warpage of packages, it is commonly employed to increase the glass transition temperature (Tg) of resins above 190° C. and to minimize the coefficient of linear expansion. The coefficient of linear expansion is reduced by increasing the amount of filler, which increases the viscosity of the composition, which in turn, hampers molding operation and causes bending of gold wires and deformation of die pads. The high glass transition temperature requires the use of resins having a high degree of polymerization, which also increases the viscosity of the composition, hampering molding operation.

SUMMARY OF THE INVENTION

An object of the invention is to provide a novel and improved semiconductor encapsulating epoxy resin composition which minimizes the warpage of packages and has satisfactory cure, catalyst latency, storage stability and adhesion, and a semiconductor device encapsulated with the cured product thereof.

The invention pertains to an epoxy resin composition comprising an epoxy resin, a phenolic resin, an inorganic filler, and a curing catalyst. We have found that by using a polyfunctional epoxy resin as the epoxy resin and microencapsulating the curing catalyst, there is obtained an epoxy resin composition which is suited for the encapsulation of packages, for example, thin packages such as TSOP and single-side molded packages such as BGA. Quite surprisingly, the warpage of the packages is minimized and the composition is endowed with fast-curing, catalyst latency, and storage stability and improved in cured strength and adhesion.

Accordingly, the invention provides an epoxy resin composition for semiconductor encapsulation comprising (A) a polyfunctional epoxy resin, (B) a phenolic resin, (C) an inorganic filler, and (D) curing catalyst-containing microcapsules having a mean particle size of 0.5 to 50 µm. A semiconductor device encapsulated with the epoxy resin composition in the cured state is also contemplated herein.

DESCRIPTION OF THE PREFERRED EMBODIMENT

In the epoxy resin composition of the invention, a polyfunctional epoxy resin is used as the epoxy resin (A). Preferably the polyfunctional epoxy resin is of the following structure.

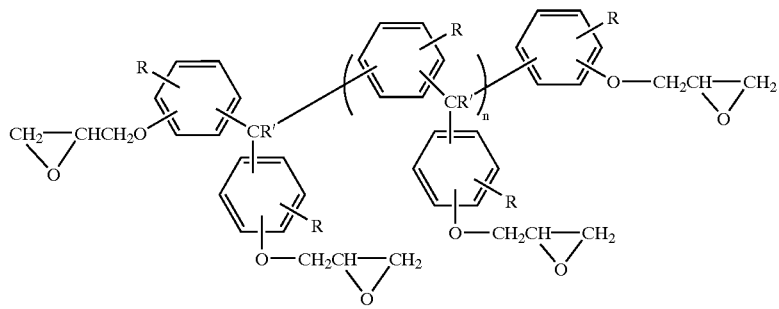

In the formula, R is hydrogen or a monovalent hydrocarbon group of 1 to 6 carbon atoms, as typified by alkyl groups including methyl, ethyl, propyl, isopropyl, n-butyl, isobutyl, tert-butyl, pentyl and hexyl. R' is hydrogen, methyl or ethyl, and preferably hydrogen. The letter n is an integer of 0 to 6.

Of the polyfunctional epoxy resins, triphenolalkane type epoxy resins such as triphenolmethane type epoxy resins and triphenolpropane type epoxy resins are preferred.

In addition to the polyfunctional epoxy resin, another epoxy resin may be used herein. Illustrative examples of suitable other epoxy resins include novolac-type epoxy resins such as phenolic novolac epoxy resins and cresol novolac epoxy resins, aralkyl type epoxy resins, biphenyl skeleton-containing aralkyl type epoxy resins, biphenyl type epoxy resins, heterocyclic epoxy resins, naphthalene ring-containing epoxy resins, bisphenol type epoxy resins such as bisphenol A epoxy resins and bisphenol F epoxy resins, and stilbene type epoxy resins, alone or in admixture of two or more.

The polyfunctional epoxy resin should preferably account for 50 to 100% by weight, and more preferably 70 to 100% by weight of the entire epoxy resins.

The epoxy resins should preferably have a softening point of 50 to 120° C. and an epoxy equivalent of 100 to 400.

Epoxy resins with a softening point of lower than 50° C. tend to form burrs and voids when molded and would result in cured products having a lower Tg whereas epoxy resins with a softening point of high than 120° C. would be too viscous to mold.

When the epoxy resins are used for the encapsulation of semiconductor devices, it is preferred that the content of hydrolyzable chlorine be up to 1,000 ppm, more preferably up to 500 ppm, and the contents of sodium and potassium be each up to 10 ppm. If semiconductor devices are encapsulated with compositions containing an epoxy resin with more than 1,000 ppm of hydrolyzable chlorine or more than 10 ppm of sodium or potassium, the encapsulated devices would experience deterioration of moisture resistance during long-term storage under hot humid conditions.

The curing agent (B) for the epoxy resins is a phenolic resin having at least two phenolic hydroxyl groups per molecule. Exemplary curing agents include phenolic resins, for example, novolac-type phenolic resins such as phenolic novolac resins and cresol novolac resins; p-xylylene-modified novolac resins, m-xylylene-modified novolac resins, o-xylylene-modified novolac resins, bisphenol type resins such as bisphenol A type resins and bisphenol F type resins, biphenyl type phenolic resins, resole type phenolic resins, phenolaralkyl resins, and triphenolalkane resins and polymerized products thereof; and naphthalene ring-bearing phenolic resins and dicyclopentadiene-modified phenolic resins.

Of these phenolic resins, phenolic novolac resins and triphenolalkane resins such as triphenolmethane, triphenolethane and triphenolpropane resins and polymers thereof are preferable from the consideration of heat resistance, package warpage and moldability. These preferred phenolic resins may be combined with any of the above-described phenolic resins insofar as the desired effect is not impeded.

Amine curing agents and acid anhydride curing agents may also be used in combination with the phenolic resins.

The phenolic resin curing agents should preferably have a softening point of 60 to 150° C., especially 70 to 130° C. and a hydroxyl equivalent of 90 to 250. When the phenolic resins are used for the encapsulation of semiconductor devices, it is preferred that the contents of sodium and potassium be each up to 10 ppm. If semiconductor devices are encapsulated with compositions containing a phenolic resin with more than 10 ppm of sodium or potassium, the encapsulated devices would experience accelerated deterioration of moisture resistance during long-term storage under hot humid conditions.

The curing agent may be blended in any desired amount. Preferably the phenolic resin curing agent is blended in such amounts that the molar ratio of phenolic hydroxyl groups in the phenolic resin to epoxy groups in the epoxy resin may range from 0.5 to 1.5, especially from 0.8 to 1.2.

The inorganic filler (C) is selected from fillers commonly used in epoxy resin compositions. The inorganic filler is blended in order to reduce the coefficient of expansion of encapsulants for reducing the stress applied to semiconductor devices. Typical of the inorganic filler are fused silica in ground or spherical form and crystalline silica. Alumina, silicon nitride, aluminum nitride, and other fillers may also be used.

To achieve a good compromise between reduced expansion of cured products and moldability of compositions, it is recommended to use a blend of fillers in spherical and ground forms or only a filler in spherical form. The inorganic filler is preferably used after it is surface treated with silane coupling agents.

The inorganic filler preferably has a mean particle size of 1 to 40 μm, more preferably 5 to 30 μm. The mean particle size as used herein can be determined, for example, as the weight average (median diameter) in the particle size distribution as measured by the laser-light diffraction method.

The inorganic filler is blended in amounts of about 100 to 1,000 parts, preferably about 250 to 1,000 parts, and more preferably about 350 to 900 parts by weight per 100 parts by weight of the epoxy resin (A) and phenolic resin (B) combined. The preferred loading of inorganic filler is at least 70%, especially at least 75% by weight of the entire composition. Epoxy resin compositions loaded with less than 70% by weight of the inorganic filler may have a high coefficient of expansion, causing greater stresses to be applied to semiconductor devices and hence, deterioration of the device characteristics. The upper limit of filler loading is usually 92% by weight.

In the epoxy resin composition of the invention, curing catalyst-containing microcapsules (D) are blended. The curing catalyst in the microcapsules may be any of well-known curing catalysts for epoxy resins. Nitrogen-containing curing catalysts and organic phosphorus curing catalysts, especially imidazole compounds and organophosphine compounds are preferred as the catalyst to be contained in microcapsules.

Useful imidazole compounds are of the following general formula (1).

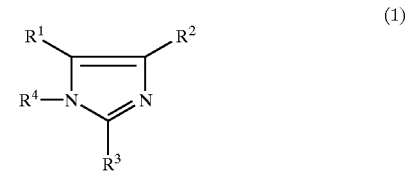

In the formula, $R^1$ and $R^2$ are independently hydrogen or substituted or unsubstituted monovalent hydrocarbon groups of 1 to 12 carbon atoms, preferably 1 to 6 carbon atoms, for example, alkyl, substituted alkyl and aryl groups, such as methyl, ethyl, hydroxymethyl and phenyl. $R^3$ is a substituted or unsubstituted monovalent hydrocarbon group of 1 to 12 carbon atoms, preferably 1 to 6 carbon atoms, for example, alkyl, alkenyl and aryl groups, such as methyl, ethyl, phenyl and allyl. $R^4$ is hydrogen or a substituted or unsubstituted monovalent hydrocarbon group of 1 to 12 carbon atoms, preferably 1 to 6 carbon atoms, for example, alkyl, substituted alkyl and aralkyl groups, such as methyl, ethyl, cyanoethyl and benzyl, or a group represented by the following formula (2). Exemplary substituted monovalent hydrocarbon groups are hydroxy and cyano-substituted ones.

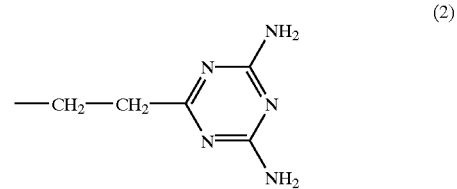

Examples of the imidazole compounds include 2-methylimidazole, 2-ethyl-4-methylimidazole, 2-phenylimidazole, 1-benzyl-2-phenylimidazole, 1-cyanoethyl-2-methylimidazole, 1-cyanoethyl-2-undecylimidazole, 1-benzyl-2-methylimidazole, 2-phenyl-4,5-dihydroxymethylimidazole, 2-allyl-4,5- diphenylimidazole, 2,4-diamino-6-[2'-methylimidazolyl-(1)']-ethyl-S-triazine, 2,4-diamino-6-[2'-ethyl-4'-methylphenyl)-(1)']-ethyl-S-triazine, 2,4-diamino-6-[2'-methylimidazolyl-(1)']-ethyl-S-triazine isocyanuric acid adduct, and 2-phenyl-4-methyl-5-hydroxymethylimidazole.

Examples of the organic phosphorus curing catalyst include organophosphines, typically triorganophosphines such as triphenylphosphine, tributylphosphine, tri(p-methylphenyl)phosphine, tri(nonylphenyl)phosphine, and diphenyltolylphosphine; a salt of a triorganophosphine with a triorganoboran such as triphenylphosphine-triphenylboran; and a salt of a tetraorganophosphonium with a tetraorganoborate such as tetraphenylphosphonium tetraphenylborate. Of these, phosphorus compounds of the following general formula (3) are preferred.

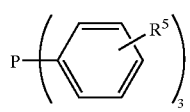

(3)

Herein, $R^5$ is hydrogen, or an alkyl or alkoxy group of 1 to 4 carbon atoms. Exemplary alkyl groups are methyl, ethyl, propyl, isopropyl, butyl, isobutyl and tert-butyl. Exemplary alkoxy groups are methoxy and ethoxy. Preferably $R^5$ is hydrogen or methyl.

Examples of the compound of formula (3) are given below.

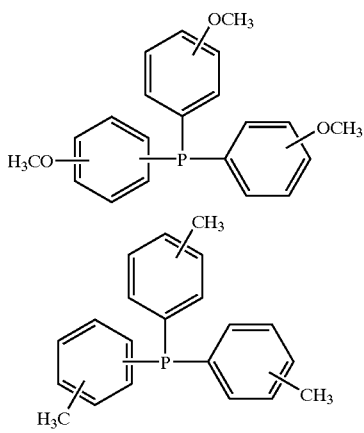

The microcapsules are obtained by microencapsulating the curing catalyst with suitable polymers. Included are polymers of (meth)acrylic monomers, for example, alkyl esters of 1 to 8 carbon atoms and similar alkyl esters whose alkyl group has a substituent such as allyl, such as acrylates, itaconates, methacrylates, and crotonates; monofunctional olefinic (or vinyl) monomers such as styrene, α-methylstyrene, acrylonitrile, methacrylonitrile, and vinyl acetate; and polyfunctional olefinic (or vinyl) monomers such as ethylene glycol di(meth)acrylate, polyethylene glycol di(meth)acrylate, divinyl benzene, bisphenol A di(meth)acrylate, and methylene bis(meth)acrylamide. Of these, polymers of (meth)acrylate monomers are preferred.

Any desired method may be employed in preparing microcapsules containing the curing catalyst, typically imidazole compounds or organophosphine compounds as mentioned above. To manufacture microcapsules having a high roundness in high yields, any suitable one of well-known suspension polymerization or emulsion polymerization methods may be used.

To manufacture high concentration microcapsules from a commonly available catalyst, about 10 to 200 parts, desirably about 10 to 100 parts, and more desirably about 20 to 50 parts by weight of the monomer(s) may be used per 10 parts by weight of the curing catalyst. With less than 10 parts of the monomer, it may become difficult to impart latency. More than 200 parts of the monomer corresponds to a lower concentration of the catalyst, which may require to increase the amount of the catalyzed microcapsules for achieving satisfactory cure, leading to an economical disadvantage. In other words, the concentration of the curing catalyst in the microcapsules may be about 5 to 50% by weight, preferably about 9 to 50% by weight, more preferably 17 to 33% by weight.

In this way, microcapsules are formed to a mean particle size of 0.5 to 50 μm, desirably 3 to 25 μm. Microcapsules with a mean particle size of less than 0.5 μm have the risk that a composition having a large amount of such microcapsules blended therein has an increased viscosity and the catalysis latency becomes insufficient. Microcapsules with a mean particle size of more than 50 μm can cause gate clogging during molding.

Further desirably, the microcapsules have the following release action. In a leaching test, 1 g of the curing catalyst-containing microcapsules is mixed with 30 g of o-cresol, the mixture is held at 30° C. for 15 minutes, and the quantity of the leached-out catalyst is determined by gas chromatography. The quantity of the leached-out catalyst is at least 70% by weight (i.e., 70 to 100% by weight) based on the entire quantity of the catalyst contained in the microcapsules. If the leach-out quantity is less than 70% in a 30° C./15 min cresol leaching test, molding of the epoxy resin composition over semiconductor devices may require a molding time of more than one minute at 175° C., leading to a low productivity. A leach-out quantity of at least 75% by weight (i.e., 75 to 100% by weight) is more desirable.

In the epoxy resin composition, the curing catalyst-containing microcapsules (D) are desirably blended in an amount of about 0.5 to 15 parts, more desirably about 1 to 10 parts by weight per 100 parts by weight of components (A) and (B) combined. Less than 0.5 part of the microcapsules may fail to provide satisfactory cure. More than 15 parts of the microcapsules ensure satisfactory cure, but increase the cost.

In the epoxy resin composition, the conventional curing catalyst (curing accelerator) which is not microcapsulated may be blended in combination with the curing catalyst-containing microcapsules. In this case, the weight ratio (B)/(A) of (B) the curing catalyst which is not microcapsulated and (A) the curing catalyst-containing microcapusules is preferably 0 to 0.5, preferably 0 to 0.2, more preferably 0 to 0.1.

For imparting flexibility or toughness or adhesiveness to the cured product of the epoxy resin composition, any of silicone-modified copolymers, various organic synthetic rubbers, thermoplastic resins such as styrene-butadiene-methyl methacrylate copolymers and styrene-ethylene-butene-styrene copolymers, silicone gel, and silicone rubber in powder form may be added to the inventive composition. The inorganic filler may be surface treated with two-part type silicone rubber or silicone gel. It is understood that the above-mentioned silicone-modified copolymers and styrene-butadiene-methyl methacrylate copolymers are effective for reducing stresses in the epoxy resin. The amount of such a silicone-modified copolymer and/or thermoplastic resin serving as the stress-reducing agent is preferably 0 to 10%, more preferably 0.2 to 5% by weight of the entire epoxy resin composition. More than 10% may detract from mechanical strength.

In the inventive composition, there may also be blended colorants (e.g., carbon black), flame retardants (e.g., brominated epoxy resins and antimony trioxide), parting agents, and coupling agents.

The epoxy resin composition of the invention is prepared as a molding material by blending the epoxy resin, curing agent, inorganic filer, curing catalyst-containing microcapsules, and other additives in a predetermined proportion, uniformly mixing them in a dry mixer or the like, melt kneading the mixture in a hot roll mill, kneader or extruder, followed by cooling for solidification and grinding to a suitable size.

The epoxy resin composition containing the catalyzed microcapsules is effectively utilized in encapsulating semiconductor devices, typically thin packages such as TSOP and single-side molded packages such as BGA. The most common encapsulation process is low pressure transfer molding. The molding temperature is usually about 160 to 190° C.

EXAMPLE

Examples of the invention are given below by way of illustration and not by way of limitation.

Examples and Comparative Examples

Epoxy resin compositions were prepared in a conventional manner using the components shown in Table 1. They were examined by the following tests, with the results shown in Table 1.

(1) Spiral Flow

Measured while molding the composition at 175° C. and 70 kgf/cm$^2$.

(2) Gel Time and Melt Viscosity

Measured at 175° C.

(3) Adhesion

Onto an entirely silver-plated copper frame of 18 mm×18 mm×0.25 mm, each epoxy resin composition was molded in a cylindrical shape so as to give a bond area of 10 mm$^2$ under the conditions: 175° C., 70 kgf/cm$^2$, and 90 seconds, followed by post-curing at 175° C. for 4 hours. A shear bond strength was measured by using a push-pull gage and applying a shear force of 60 mm/min to the cylindrical molding transversely.

(4) Storage Stability

Each epoxy resin composition was placed in a closed container and held at 30° C. for 96 hours. The spiral flow was measured again. A retentivity (%) of spiral flow was calculated from the initial and aged values and used as an index of storage stability.

(5) Package Warpage

A BT substrate of 35 mm×35 mm×0.6 mm having a chip of 7 mm×7 mm mounted thereon was encapsulated with each epoxy resin composition. The warpage of the package was measured at the initial and after post-curing.

TABLE 1

| Components (pbw) | E1 | CE1 | E2 | CE2 |
| --- | --- | --- | --- | --- |
| EPPN501 | 56.8 | 56.8 | 56.8 | 56.8 |
| TD2093 | 37.2 | 37.2 | 37.2 | 37.2 |
| BREN-S | 6 | 6 | 6 | 6 |
| Spherical fused silica (mean particle size 15 μm) | 700 | 700 | 700 | 700 |
| KBM403 | 1.5 | 1.5 | 1.5 | 1.5 |
| Carbon black | 3 | 3 | 3 | 3 |
| Sb$_2$O$_3$ | 10 | 10 | 10 | 10 |
| 2E4MZ | — | 0.8 | — | — |
| 2E4MZ microcapsules | 5.0 | — | — | — |
| TPP | — | — | — | 0.6 |
| TPP microcapsules | — | — | 5.5 | — |
| Spiral flow (cm) | 108 | 92 | 102 | 89 |
| Gel time (sec) | 18 | 16 | 18 | 15 |
| Melt viscosity (poise) | 120 | 185 | 115 | 193 |
| Package warpage, initial (μm) | 40 | 81 | 77 | 52 |
| Package warpage, postcured (μm) | 25 | 102 | 39 | 71 |
| Bond strength, postcured (kgf) | 10.4 | 10.2 | 10.7 | 10.2 |
| Retentivity (%) | 92 | 24 | 90 | 47 |

EPPN501: triphenolmethane type epoxy resin, Nippon Kayaku K.K.
BREN-S: brominated phenol novolak type epoxy resin, Nippon Kayaku K.K.
TD2093: phenol novolac resin, Dai-Nippon Ink & Chemicals K.K.
Sb$_2$O$_3$: antimony trioxide, Sumitomo Metal Mining K.K.
KBM403: γ-glycidoxypropyltrimethoxysilane, Shin-Etsu Chemical Co., Ltd.
2E4MZ: 2-ethyl-4-methylimidazole
2E4MZ microcapsules: microcapsules made of a polymer of methyl methacrylate containing 25% by weight of 2E4MZ, and having a mean particle size of 14 μm. The quantity of the catalyst leached out of the microcapsules in o-cresol at 30° C. for 15 minutes is 90% by weight.
TPP: triphenylphosphine
TPP microcapsules: microcapsules made of a copolymer of methyl methacrylate and styrene containing 30% by weight of triphenylphosphine, and having a mean particle size of 10 μm. The quantity of the catalyst leached out of the microcapsules in o-cresol at 30° C. for 15 minutes is 85% by weight.

There has been described a semiconductor encapsulating epoxy resin composition which minimizes the warpage of packages and has satisfactory cure, catalyst latency, and storage stability.

Japanese Patent Application No. 11-232198 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An epoxy resin composition for semiconductor encapsulation, comprising:
    (A) a substituted or unsubstituted triphenol-alkane epoxy resin,
    (B) a phenolic resin,
    (C) an inorganic filler, and
    (D) curing catalyst-containing microcapsules having a mean particle size of 0.5 to 50 μm.

2. The epoxy resin composition of claim 1 wherein the microcapsules include a polymer comprising a (meth) acrylate monomer and a curing catalyst comprising a nitrogenous compound and/or an organic phosphorus compound.

3. An epoxy resin composition for semiconductor encapsulation, comprising:

(A) a substituted or unsubstituted triphenolalkane epoxy resin, (B) an inorganic filler, and (C) curing catalyst-containing microcapsules having a mean particle size of 0.5 to 50 μm, said microcapsules including a polymer comprising a (meth)acrylate monomer and a curing catalyst comprising a nitrogenous compound and/or an organic phosphorus compound, and the quantity of the leached-out catalyst being at least 70% by weight based on the entire quantity of the catalyst contained in the microcapsules when 1 g of the curing catalyst-containing microcapsules mixed with 30 g of o-cresol and the mixture is held at 30° C. for 15 minutes.

4. The epoxy resin composition of claim 1 wherein component (D) is present at a rate of 1 to 10 parts by weight per 100 parts by weight of components (A) and (B) combined.

5. The epoxy resin composition of claim 1, further comprising a curing accelerator which is not microencapsulated.

6. The epoxy resin composition of claim 1 wherein epoxy resin (A) has a softening point of 50 to 120° C. and phenolic resin (B) has a softening point of 70 to 130° C.

7. The epoxy resin composition of claim 1 wherein the loading of inorganic filler (C) is at least 75% by weight of the entire composition.

8. The epoxy resin composition of claim 3, further comprising a curing accelerator which is not microencapsulated.

9. The epoxy resin composition of claim 1 wherein epoxy resin (A) has a softening point of 50 to 120° C. and phenolic resin (B) has a softening point of 70 to 130° C.

10. The epoxy resin composition of claim 1 wherein the loading of inorganic filler (C) is at least 75% by weight of the entire composition.

11. A semiconductor device encapsulated with the epoxy resin composition of any one of claims 1, 2, 3 through 7, or 8 through 10, in the cured state.

* * * * *